(12) United States Patent
Zong

(10) Patent No.: US 10,541,116 B2
(45) Date of Patent: Jan. 21, 2020

(54) MULTI-SOURCE LOW-POWER LOW-TEMPERATURE PLASMA POLYMERIZED COATING DEVICE AND METHOD

(71) Applicant: Jiangsu Favored Nanotechnology Co., Ltd., Jiangsu (CN)

(72) Inventor: Jian Zong, Jiangsu (CN)

(73) Assignee: JIANGSU FAVORED NANOTECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 16/095,179

(22) PCT Filed: Apr. 25, 2017

(86) PCT No.: PCT/CN2017/081772
§ 371 (c)(1),
(2) Date: Oct. 19, 2018

(87) PCT Pub. No.: WO2018/098979
PCT Pub. Date: Jun. 7, 2018

(65) Prior Publication Data
US 2019/0148117 A1 May 16, 2019

(30) Foreign Application Priority Data
Nov. 30, 2016 (CN) .......................... 2016 1 1076507

(51) Int. Cl.
*H01J 37/32* (2006.01)
*B05B 5/08* (2006.01)
*B05B 5/10* (2006.01)

(52) U.S. Cl.
CPC .......... *H01J 37/32449* (2013.01); *B05B 5/08* (2013.01); *B05B 5/10* (2013.01);
(Continued)

(58) Field of Classification Search
CPC .......... H01J 37/32449; H01J 37/32541; H01J 37/32568; H01J 37/32834; B05B 5/08; B05B 5/10
See application file for complete search history.

(56) References Cited

U.S. PATENT DOCUMENTS 8,021,514 B2    9/2011  Fu et al.
2015/0099069 A1  4/2015  Taylor et al.

FOREIGN PATENT DOCUMENTS

CN    101243733 A    8/2008
CN    101245449 A    8/2008
(Continued)

*Primary Examiner* — Robert S Walters, Jr.
(74) *Attorney, Agent, or Firm* — Muncy, Geissler, Olds & Lowe, P.C.

(57) ABSTRACT

A multi-source low-power low-temperature plasma polymerized coating device and method belong to the technical field of plasma. In the device, a plurality of discharge cavities are mounted on the wall of a main vacuum chamber; a plane grounding grid mesh and a porous electrode plate are mounted in each discharge cavity; and the porous electrode plate is parallel to the grid mesh, keeps a gap with the grid mesh and is connected with a low-power high-frequency power source. A carrier gas pipeline and a monomer steam pipeline are respectively connected to each discharge cavity. To-be-treated base material is placed in the main vacuum chamber. The vacuum pump is started to feed carrier gas and monomer steam. The wall of the discharge cavity is discharged by the porous electrode plate; the monomer steam is polymerized; and the polymerisate passes through small holes and the grid mesh successively in the porous electrode plate to enter the vacuum chamber and deposit on the surface of the base material to form a polymer coating. The device of the present invention has the advantages of even spatial distribution of plasma, good quality uniformity of products under batch treatment, low plasma energy and density,
(Continued)

(Fig.1 as an illustration in Abstract)

difficult in excessively destroying a chemical monomer structure and good quality of the formed polymer coating.

8 Claims, 1 Drawing Sheet

(52) U.S. Cl.
CPC .. *H01J 37/32541* (2013.01); *H01J 37/32568* (2013.01); *H01J 37/32834* (2013.01)

(56) References Cited

FOREIGN PATENT DOCUMENTS

| | | |
|---|---|---|
| CN | 205616834 U | 10/2016 |
| CN | 206215404 U | 6/2017 |

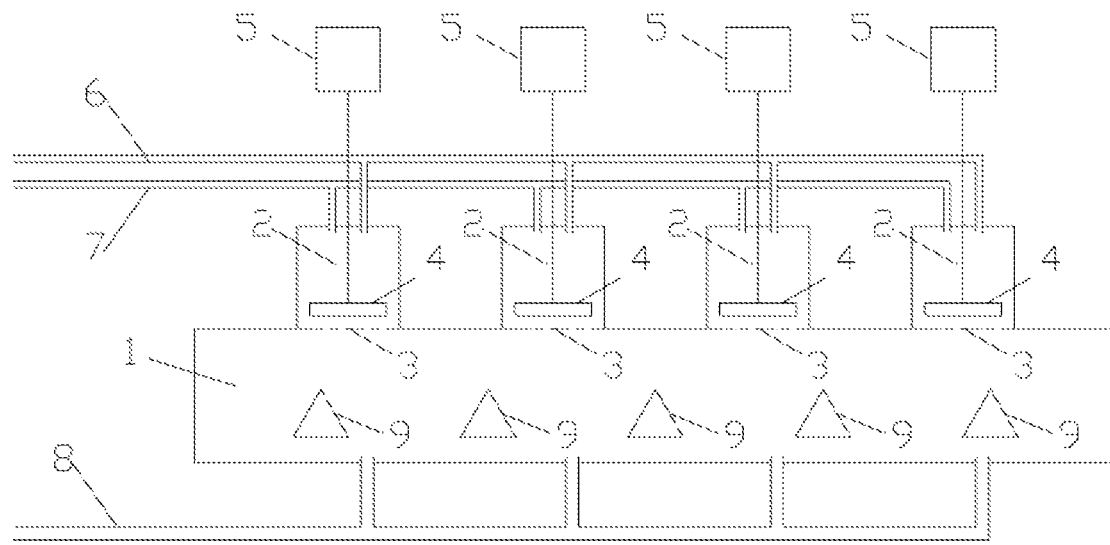
Fig. 1(Fig.1 as an illustration in Abstract)
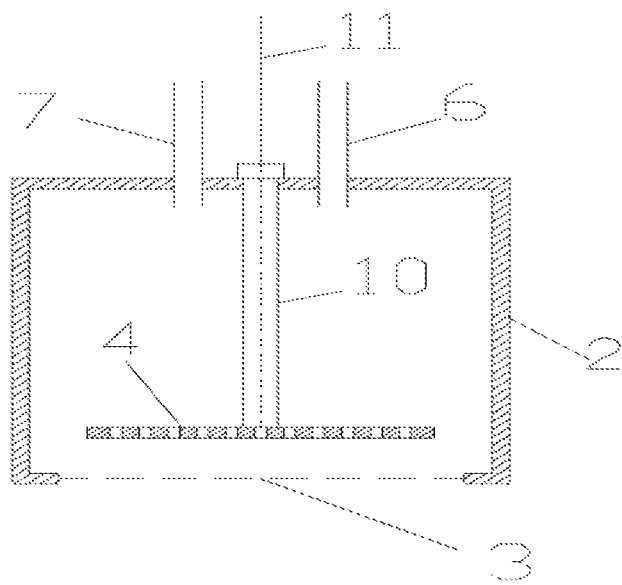
Fig. 2

MULTI-SOURCE LOW-POWER LOW-TEMPERATURE PLASMA POLYMERIZED COATING DEVICE AND METHOD

TECHNICAL FIELD

The present invention belongs to the technical field of plasmas, and particularly relates to a low-temperature plasma polymerized coating device and method.

BACKGROUND

Plasma Surface treatment as an effective method for improving material surface performance is widely applied to the fields of aerospace, automotive manufacturing, machinery, heavy industry, hardware tool manufacturing, etc. Plasma polymerized coating is an important surface treatment method. In the process of plasma polymerized coating, process gas and gaseous organic monomer shall be introduced into a vacuum chamber; plasma processing is performed on an organic gaseous monomer through discharge to produce all kinds of reactive species; and an addition reaction is conducted between the reactive species or between the reactive species and the monomer to form a polymer. Because the polymer coating is electrically insulated generally, a high-frequency discharge source must be used usually to produce plasma. To increase production efficiency and reduce the cost, the existing plasma polymerized coating device increases the area of the discharge source as much as possible to simultaneously treat more base materials. But the high-frequency discharge source with large area has large power threshold, generates plasma with high energy and high density, and is easy to excessively destroy a chemical monomer structure and cause bad quality of the formed polymer coating. In addition, because the high-frequency discharge source with large area has a standing wave effect, the generated plasma is uneven in spatial distribution so that the quality of products under batch treatment has bad uniformity.

Theoretically, the above problem can be solved by replacing a single high-frequency discharge source with large area and high power by combining a plurality of high-frequency discharge sources with small area and low power. However, in fact, because different high-frequency discharge sources are difficult to realize completely consistent phases and have mutual crosstalk, the high-frequency discharge sources are instable in operation and may burn out power supplies in severe cases. To reduce the crosstalk among the high-frequency discharge sources, the distance among the high-frequency discharge sources must be increased, while the generated plasmas may be uneven in spatial distribution if the distance among the high-frequency discharge sources is increased.

SUMMARY

The purpose of the present invention is to provide a multi-source low-power low-temperature plasma polymerized coating device with respect to the problems that the high-frequency discharge source with large area and high power used in the existing plasma polymerized coating device generates plasma with uneven spatial distribution, the quality of products under batch treatment has bad uniformity, the energy of plasma is high, the density is high and it is easy to excessively destroy a chemical monomer structure and cause bad quality of the formed polymer coating as well as the problems of mutual crosstalk among the high-frequency discharge sources, uneven spatial distribution of the generated plasmas, etc. due to the combination of a plurality of high-frequency discharge sources with small area and low power.

To realize the above-mentioned purposes, the present invention adopts the technical solution:

A plurality of discharge cavities are mounted close to each other on the wall of a main vacuum chamber. A plane grounding grid mesh is mounted at the opening of each discharge cavity that leads to the main vacuum chamber to shield mutual crosstalk among the discharge cavities. The porous electrode plate is mounted in each discharge cavity near the grid mesh. The porous electrode plate is parallel to the grid mesh and keeps a small gap with the grid mesh to eliminate the plasma therebetween and prevent electromagnetic waves in the discharge cavities from propagating into the main vacuum chamber through the plasma. Through holes uniformly distributed in the porous electrode plate can be passed by electrically neutral discharge products and active groups to enter the main vacuum chamber through the grid mesh. The porous electrode plate is fixed to the wall of the discharge cavity through an insulating bracket, and is connected with a low-power high-frequency power source through a conducting wire. The porous electrode plate in each discharge cavity is connected with a low-power high-frequency power source so that the porous electrode plate discharges the wall of the discharge cavity and the plasma is produced in the discharge cavity. The carrier gas pipeline and the monomer steam pipeline are respectively connected to each discharge cavity. The other ends of the carrier gas pipeline and the monomer steam pipeline are respectively connected to a carrier gas source and a monomer steam source. A vacuum exhaust tube is connected to the main vacuum chamber, and the other end of the vacuum exhaust tube is connected to the vacuum pump. The to-be-treated base material is placed in the main vacuum chamber, and located outside the discharge cavity. The carrier gas and the monomer steam are discharged in each discharge cavity. The monomer steam is polymerized; and under the driving of the carrier airflow, polymerisate passes through small holes and the grid mesh successively in the porous electrode plate to enter the vacuum chamber and deposit on the surface of the base material to form a polymer coating.

Each discharge cavity is cylindrical and is made of metal; the diameter range is $\varphi 50$ to $\varphi 200$ mm; and the depth is 30-150 mm.

A spacing between adjacent axes of the discharge cavities is 70-400 mm.

A gap between the porous electrode plate and the grid mesh is less than 8 mm.

The through holes distributed in the porous electrode plate have a diameter of 1-10 mm and a hole pitch of 1-10 mm.

The low-power high-frequency power source has a power of 5-100 w and a frequency of 20 KHz-300 MHz.

The vacuum exhaust tube is connected to the wall of the main vacuum chamber which is opposite to the discharge cavity.

A method for coating the multi-source low-power low-temperature plasma polymerized coating device mainly comprises the following steps:

(1) placing the to-be-treated base material in the vacuum chamber, and opening the vacuum pump to pump a vacuum degree in the vacuum chamber to be lower than 1 Pa;

(2) opening the carrier gas pipeline and the monomer steam pipeline, taking carrier gas and monomer steam into the pipelines and maintaining a vacuum degree in the vacuum chamber to be 2-30 Pa; and (3) starting the low-power high-frequency power source; discharging the wall of the discharge cavity by the porous electrode plate; polymerizing the monomer steam; and driving polymerisate by carrier airflow so that the polymerisate passes through small holes and the grid mesh successively in the porous electrode plate to enter the vacuum chamber and deposit on the surface of the base material to form a polymer coating.

The carrier gas is one or a mixture of argon and helium.

Compared with the prior art, the technical solution of the present invention has the following advantages:

(4) Because a plurality of discharge cavities are mounted in the vacuum chamber, and the plurality of discharge cavities which are separated but mutually close to each other avoid a standing wave effect in a single large-area discharge source, the spatial distribution of the plasma in the vacuum chamber is even and the quality uniformity of products under batch treatment is good.

(5) Compared with the single large-area electrode discharge source, each low-power discharge source has small discharge power threshold, and has small total discharge power, low energy and density of generated plasma, difficult in excessively destroying a chemical monomer structure and good quality of the formed polymer coating.

(6) The grid mesh is grounded and the porous electrode plate is parallel to and near the grid mesh to eliminate the plasma therebetween, effectively block electromagnetic waves in each discharge cavity from propagating into the main vacuum chamber through the plasma and avoid mutual interference among the discharge cavities so that the discharge cavities can be installed close to each other, the spatial distribution of the plasma in the vacuum chamber is even and the quality uniformity of products under batch treatment is good.

DESCRIPTION OF DRAWINGS

FIG. 1 is a schematic diagram of a multi-source low-power low-temperature plasma polymerized coating device.

FIG. 2 is a structural schematic diagram of a discharge cavity in FIG. 1.

In the figures: 1. main vacuum chamber; 2. discharge cavity; 3. grid mesh; 4. porous electrode plate; 5. low-power high-frequency power source; 6. carrier gas pipeline; 7. monomer steam pipeline; 8. vacuum exhaust tube; 9. base material; 10. insulating bracket; and 11. conducting wire.

DETAILED DESCRIPTION

The present invention is further described below in combination with drawings and specific embodiments. However, the present invention is not limited to the specific embodiments.

Embodiment 1

A multi-source low-power low-temperature plasma polymerized coating device is provided. In the device, a plurality of discharge cavities are installed on the wall of a main vacuum chamber; each discharge cavity is cylindrical and is made of metal; the diameter range is φ50; and the depth is 150 mm. A spacing between adjacent axes of the discharge cavities is 70 mm. A plane grounding grid mesh is mounted at the opening of each discharge cavity that leads to the main vacuum chamber. The porous electrode plate is mounted in each discharge cavity near the grid mesh. The through holes are uniformly distributed in the porous electrode plate. The through holes have a diameter of 1 mm and a hole pitch of 1 mm. The porous electrode plate is parallel to the grid mesh and a gap between the porous electrode plate and the grid mesh is less than 8 mm. The porous electrode plate is fixed through an insulating bracket, and is connected with a low-power high-frequency power source through a conducting wire. The low-power high-frequency power source has a power of 5 w and a frequency of 20 kHz. The carrier gas pipeline and the monomer steam pipeline are connected to each discharge cavity. The other ends of the carrier gas pipeline and the monomer steam pipeline are respectively connected to a carrier gas source and a monomer steam source. A vacuum exhaust tube is connected to the wall of main vacuum chamber opposed to the discharge cavity, and the other end of the vacuum exhaust tube is connected to the vacuum pump. The to-be-treated base material is put into the main vacuum chamber and located outside the discharge cavity.

Embodiment 2

A method for coating the multi-source low-power low-temperature plasma polymerized coating device in embodiment 1 mainly comprises the following steps:

(1) placing the to-be-treated base material in the vacuum chamber, and opening the vacuum pump to pump a vacuum degree in the vacuum chamber to be 1 Pa;

(2) feeding carrier gas so that the carrier gas enters the discharge cavity and the vacuum chamber through the carrier gas pipeline, wherein the carrier gas is argon and a vacuum degree in the vacuum chamber is maintained as 30 Pa; feeding monomer steam so that the monomer steam enters the vacuum chamber through the monomer steam pipeline, wherein the monomer steam contains at least one unsaturated carbon-carbon bond; one unsaturated carbon atom does not contain a substituent group; the monomer structure may contain halogen functional groups or other functional groups; the halogen functional groups are one or more of F, Cl, Br and I; and other functional groups are one or more of a hydroxyl group, a carboxyl group, an epoxy group and a silica group, such as a monomer of dimethyl vinyl ethoxylsilane;

(3) starting the low-power high-frequency power source; discharging the wall of the discharge cavity by the porous electrode plate; polymerizing the monomer steam; and driving polymerisate by carrier airflow so that the polymerisate passes through small holes and the grid mesh successively in the porous electrode plate to enter the vacuum chamber and deposit on the surface of the base material to form a polymer coating.

Embodiment 3

A multi-source low-power low-temperature plasma polymerized coating device is provided. In the device, a plurality of discharge cavities are installed on the wall of a main vacuum chamber; each discharge cavity is cylindrical and is made of metal; the diameter range is φ200; and the depth is 30 mm. A spacing between adjacent axes of the discharge cavities is 400 mm. A plane grounding grid mesh is mounted at the opening of each discharge cavity that leads to the main vacuum chamber. The porous electrode plate is mounted in each discharge cavity near the grid mesh. The through holes are uniformly distributed in the porous electrode plate. The through holes have a diameter of 10 mm and a hole pitch of 10 mm. The porous electrode plate is parallel to the grid mesh and a gap between the porous electrode plate and the grid mesh is less than 8 mm. The porous electrode plate is fixed through an insulating bracket, and is connected with a low-power high-frequency power source through a conducting wire. The low-power high-frequency power source has a power of 100 W and a frequency of 300 MHz. The other ends of the carrier gas pipeline and the monomer steam pipeline are respectively connected to a carrier gas source and a monomer steam source. A vacuum exhaust tube is connected to the wall of main vacuum chamber opposed to the discharge cavity, and the other end of the vacuum exhaust tube is connected to the vacuum pump. The to-be-treated base material is put into the main vacuum chamber and located outside the discharge cavity.

Embodiment 4

A method for coating the multi-source low-power low-temperature plasma polymerized coating device in embodiment 3 mainly comprises the following steps:

(1) placing the to-be-treated base material in the vacuum chamber, and opening the vacuum pump to pump a vacuum degree in the vacuum chamber to be lower than 0.5 Pa;

(2) feeding carrier gas so that the carrier gas enters the discharge cavity and the vacuum chamber through the carrier gas pipeline, wherein the carrier gas is helium and a vacuum degree in the vacuum chamber is maintained as 12 Pa; feeding monomer steam so that the monomer steam enters the vacuum chamber through the monomer steam pipeline, wherein the monomer steam contains at least one unsaturated carbon-carbon bond; one unsaturated carbon atom does not contain a substituent group; the monomer structure may contain halogen functional groups or other functional groups; the halogen functional groups are one or more of F, Cl, Br and I; and other functional groups are one or more of a hydroxyl group, a carboxyl group, an epoxy group and a silica group, such as a monomer of trifluoroethyl methacrylate;

(3) starting the low-power high-frequency power source; discharging the wall of the discharge cavity by the porous electrode plate; polymerizing the monomer steam; and driving polymerisate by carrier airflow so that the polymerisate passes through small holes and the grid mesh successively in the porous electrode plate to enter the vacuum chamber and deposit on the surface of the base material to form a polymer coating.

Embodiment 5

A multi-source low-power low-temperature plasma polymerized coating device is provided. In the device, a plurality of discharge cavities are installed on the wall of a main vacuum chamber; each discharge cavity is cylindrical and is made of metal; the diameter range is φ100; and the depth is 90 mm. A spacing between adjacent axes of the discharge cavities is 200 mm. A plane grounding grid mesh is mounted at the opening of each discharge cavity that leads to the main vacuum chamber. The porous electrode plate is mounted in each discharge cavity near the grid mesh. The through holes are uniformly distributed in the porous electrode plate. The through holes have a diameter of 5 mm and a hole pitch of 5 mm. The porous electrode plate is parallel to the grid mesh and a gap between the porous electrode plate and the grid mesh is less than 8 mm. The porous electrode plate is fixed through an insulating bracket, and is connected with a low-power high-frequency power source through a conducting wire. The low-power high-frequency power source has a power of 50 W and a frequency of 100 MHz. The other ends of the carrier gas pipeline and the monomer steam pipeline are respectively connected to a carrier gas source and a monomer steam source. A vacuum exhaust tube is connected to the wall of main vacuum chamber opposed to the discharge cavity, and the other end of the vacuum exhaust tube is connected to the vacuum pump. The to-be-treated base material is put into the main vacuum chamber and located outside the discharge cavity.

Embodiment 6

A method for coating the multi-source low-power low-temperature plasma polymerized coating device in embodiment 3 mainly comprises the following steps:

(1) placing the to-be-treated base material in the vacuum chamber, and opening the vacuum pump to pump a vacuum degree in the vacuum chamber to be 0.06 Pa;

(2) feeding carrier gas so that the carrier gas enters the discharge cavity and the vacuum chamber through the carrier gas pipeline, wherein the carrier gas includes argon and helium and a vacuum degree in the vacuum chamber is maintained as 2 Pa; feeding monomer steam so that the monomer steam enters the vacuum chamber through the monomer steam pipeline, wherein the monomer steam contains at least one unsaturated carbon-carbon bond; one unsaturated carbon atom does not contain a substituent group; the monomer structure may contain halogen functional groups or other functional groups; the halogen functional groups are one or more of F, Cl, Br and I; and other functional groups are one or more of a hydroxyl group, a carboxyl group, an epoxy group and a silica group, such as monomers of methacrylic acid and 2-hydroxyethyl methacrylate;

(3) starting the low-power high-frequency power source; discharging the wall of the discharge cavity by the porous electrode plate; polymerizing the monomer steam; and driving polymerisate by carrier airflow so that the polymerisate passes through small holes and the grid mesh successively in the porous electrode plate to enter the vacuum chamber and deposit on the surface of the base material to form a polymer coating.

I claim:

1. A multi-source low-power plasma coating device, wherein a plurality of discharge cavities are mounted on a wall of a main vacuum chamber; a plane grounding grid mesh is mounted at an opening of each discharge cavity that leads to the main vacuum chamber; a porous electrode plate is mounted in each discharge cavity; the porous electrode plate is parallel to the grid mesh and keeps a gap with the grid mesh of less than 8 mm; the porous electrode plate is fixed to a wall of the discharge cavity through an insulating bracket; the porous electrode plate is connected with a low-power high-frequency power source through a conducting wire; through holes are uniformly distributed in the porous electrode plate; a carrier gas pipeline and a monomer gas pipeline are respectively connected to each discharge cavity; the other ends of the carrier gas pipeline and the monomer gas pipeline are respectively connected to a carrier gas source and a monomer vapor source; a vacuum exhaust tube is connected to the main vacuum chamber; the other end of the vacuum exhaust tube is connected to a vacuum pump; and to-be-treated base material is placed in the main vacuum chamber and is located outside the discharge cavities.

2. The multi-source low-power plasma coating device according to claim 1, wherein each discharge cavity is cylindrical and is made of metal; a diameter of each discharge cavity is 50 to 200 mm; and a depth of each discharge cavity is 30-150 mm.

3. The multi-source low-power plasma coating device according to claim 1, wherein axes of adjacent discharge cavities of the plurality of discharge cavities are 70-400 mm apart from each other.

4. The multi-source low-power plasma coating device according to claim 1, wherein the through holes distributed in the porous electrode plate have a diameter of 1-10 mm and a hole pitch of 1-10 mm.

5. The multi-source low-power plasma coating device according to claim 1, wherein the low-power high-frequency power source has a power of 5-100 w and a frequency of 20 khz-300 mhz.

6. The multi-source low-power plasma coating device according to claim 1, wherein the vacuum exhaust tube is connected to an inner wall of the main vacuum chamber which is opposite to the discharge cavity.

7. A method for coating a to-be-treated base material using the multi-source low-power plasma coating device according to claim 1, wherein the method mainly comprises the following steps:

(1) placing the to-be-treated base material in the vacuum chamber, and opening the vacuum pump to pump a vacuum degree in the vacuum chamber to be lower than 1 pa;

(2) opening the carrier gas pipeline and the monomer gas pipeline, taking carrier gas and monomer gas into the pipelines and maintaining the vacuum degree in the vacuum chamber to be 2-30 pa;

(3) starting the low-power high-frequency power source; discharging the wall of the discharge cavity by the porous electrode plate; polymerizing the monomer gas; and driving polymerisate by carrier airflow so that the polymerisate passes the through holes in the porous electrode plate and the grid mesh successively to enter the vacuum chamber and deposit on the surface of the base material to form a polymer coating.

8. The method for coating a to-be-treated base material using the multi-source low-power plasma coating device according to claim 7, wherein the carrier gas is one or a mixture of argon and helium.

* * * * *